(12) United States Patent
Saranathan et al.

(10) Patent No.: US 7,714,575 B2
(45) Date of Patent: May 11, 2010

(54) METHOD AND APPARATUS FOR ENHANCED MAGNETIC PREPARATION IN MR IMAGING

(75) Inventors: Manojkumar Saranathan, Rochester, MN (US); Thomas K. F. Foo, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 262 days.

(21) Appl. No.: 12/098,866

(22) Filed: Apr. 7, 2008

(65) Prior Publication Data

US 2008/0224697 A1   Sep. 18, 2008

Related U.S. Application Data

(63) Continuation-in-part of application No. 10/605,645, filed on Oct. 15, 2003.

(51) Int. Cl.
*G01V 3/00* (2006.01)
(52) U.S. Cl. ..................... 324/309; 324/300
(58) Field of Classification Search ......... 324/300–322; 600/407–445
See application file for complete search history.

(56) References Cited

U.S. PATENT DOCUMENTS

| | | | |
|---|---|---|---|
| 4,564,017 A * | 1/1986 | Glover | 600/410 |
| 5,245,282 A | 9/1993 | Mugler, III et al. | |
| 5,337,000 A * | 8/1994 | Bruder | 324/309 |
| 5,347,216 A | 9/1994 | Foo | |
| 5,873,825 A | 2/1999 | Mistretta et al. | |
| 6,242,916 B1 | 6/2001 | King | |
| 6,380,740 B1 * | 4/2002 | Laub | 324/309 |
| 6,483,307 B2 | 11/2002 | Ookawa | |
| 6,639,211 B1 * | 10/2003 | Anand et al. | 250/282 |
| 6,700,374 B1 * | 3/2004 | Wu et al. | 324/312 |
| 6,794,869 B2 * | 9/2004 | Brittain | 324/309 |
| 6,914,429 B2 | 7/2005 | Ookawa | |
| 7,003,343 B2 | 2/2006 | Watts et al. | |
| 7,034,533 B2 * | 4/2006 | Mugler et al. | 324/318 |
| 7,372,266 B2 * | 5/2008 | Markl et al. | 324/307 |
| 2001/0004211 A1 | 6/2001 | Ookawa | |
| 2005/0007110 A1 | 1/2005 | Zhou | |

(Continued)

OTHER PUBLICATIONS

Amano, MD, et al., "Fat-Suppressed Three-Dimensional MR Angiography Technique With Elliptical Centric View Order and No Prolonged Breath-Holding Time," Journal Of Magnetic Resonance Imaging, 2002, vol. 16, pp. 707-715.

(Continued)

*Primary Examiner*—Brij B Shrivastav
(74) *Attorney, Agent, or Firm*—Ziolkowski Patent Solutions Group, SC

(57) ABSTRACT

The present invention provides a system and method of enhanced magnetic preparation in MR imaging. An imaging technique is disclosed such that k-space is segmented into a number of partitions, wherein the central regions of k-space is acquired prior to the periphery of k-space. The imaging technique also includes the application of magnetic preparation pulses at a variable rate. In this regard, the rate of application of magnetic preparations pulses is varied as a function of the distance from the center of k-space. The amplitude of the magnetic preparation pulses is also varied based on the incremental distance of a partition from the center of k-space.

20 Claims, 5 Drawing Sheets

U.S. PATENT DOCUMENTS

2005/0070785 A1     3/2005    Ahluwalia et al.
2008/0129298 A1*   6/2008    Vaughan et al. ............. 324/322

OTHER PUBLICATIONS

Foo, PhD, et al., "Single-Breath-Hold Venous or Arterial Flow—suppressed Pulmonary Vascular MR Imaging with Phased-Array Coils," JMRI, 1993, vol. 3, pp. 611-616.

Foo, PhD, et al., "Inversion in the Steady State: Contrast Optimization and Reduced Imaging Time with Fast Three-dimensional inversion-Recovery—prepared GRE Pulse Sequences," Magnetic Resonance Imaging, Radiology, 1994, vol. 191, pp. 85-90.

Hargreaves et al., "Fat-Suppressed Steady-State Free Precession Imaging Using Phase Detection," Magnetic Resonance in Medicine, 2003, vol. 50, pp. 210-213.

Jezzard, "Physical Basis of Spatial Distortions in Magnetic Resonance Images," Handbook of Medical Imaging Processing and Analysis, Academic Press, 2000, pp. 425-438, San Diego.

Riederer, "Currect Technical Development of Magnetic Resonance Imaging," Engineering In Medicine And Biology Magazine, IEEE, Sep./Oct. 2000, vol. 19, Issue 5, pp. 34-41.

Wieben et al., "Simulation of Optimized Time-Resolved Segmented Elliptical-Centric 3D TRICKS for Abdominal MRA," ISMRM 2000 Conference Proceedings No. 1799.

Wilman, PhD, et al., "Fluoroscopically Triggered Contrast-enhanced Three-dimensional MR Angiography with Elliptical Centric View Order: Application to the Renal Arteries," Radiology, Oct. 1997, vol. 205, No. 1, pp. 137-146.

* cited by examiner

METHOD AND APPARATUS FOR ENHANCED MAGNETIC PREPARATION IN MR IMAGING

CROSS REFERENCE TO RELATED APPLICATION

The present application is a continuation-in-part and claims priority of U.S. patent application Ser. No. 10/605,645 filed Oct. 15, 2003.

BACKGROUND OF THE INVENTION

The present invention relates generally to magnetic resonance (MR) imaging and, more particularly, to a method and apparatus for enhanced magnetic preparation in MR imaging. The present invention is further related to variable rate suppression with elliptical centric phase ordered acquisition of MR data. Additionally, the present invention is directed to an imaging sequence that supports fat suppressed contrast enhanced abdominal scans with improved delineation of vessels in structures as well as a high degree of fat suppression without compromising temporal resolution in contrast enhanced first pass breast imaging applications. The present invention is also applicable to other magnetization preparation schemes such as IR preparation, $T_2$ separation, magnetization transfer, and the like, as well as signal suppression in other targeted tissues.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

Angiography is the imaging of flowing blood in the arteries and the veins of a patient. MR angiography (MRA) is an imaging modality that produces images of flowing blood that may be analyzed in the identification and diagnosis of tissue abnormalities and pathologies. Elliptical centric phase ordered acquisition is a widely used MRA imaging technique that is used for the suppression of venous signal as well as increasing immunity to breathing artifacts. In elliptical centric ordering, k-space is reordered such that data is acquired in the order of increasing k-space radial distance. That is, data for the central region of k-space is acquired before the periphery of k-space is acquired. Since a significant contribution to the power spectrum of the acquired signal comes from the central region of k-space, the center of k-space is a major determinant of image contrast. As a result, for contrast enhanced acquisition, the acquisition of the central region at the time of contrast bolus arrival after injection is critical for delineation of the arteries without contamination from venous signal in angiographic applications.

Magnetization preparation is commonly employed in MRI to obtain variable contrast weighting like inversion-recovery preparation, fat suppression, and the like. Typically, a preparation sequence is played out every TR or once every N TRs. One proposed MR angiographic imaging technique with elliptical centric acquisition utilizes uniform, periodic application of magnetic preparation pulses. That is, magnetic preparation pulses are played out once every 15 TRs, 30 TRs, 60 TRs, 120 TRs, 240 TRs, or 480 TRs. It has been suggested that playing out magnetic preparation or fat saturation pulses every 480 TRs or twice per acquisition is optimal. However, images reconstructed from acquisitions with bi-application of fat saturation pulses have shown to have considerable residual fat signal as well as observable ghosting artifacts. Further, it has been shown that playing out fat saturation pulses at a uniform rate even as often as every 20 TRs results in non-uniform fat suppression and ghosting. This non-uniformity in fat suppression and ghosting is particularly problematic for those applications that require a high degree of uniform fat suppression such as breast imaging where it is important for detection of small tumor masses.

Moreover, the acquisition of the center of k-space is also important in a number of applications where a magnetization preparation pulse is required for effectiveness. For example, centric ordering of k-space is important when there is a need for fat suppression with a constraint of minimizing acquisition time. In this case, intermittent fat suppression or magnetization preparation pulses may be used rather than a conventional approach of one magnetization preparation pulse per RF excitation pulse. Some MR applications require fat saturation for improved visualization of vessels and structures. For example, in abdominal imaging, an elliptical centric acquisition enables depiction of the arteries without venous contamination during the first pass of a contrast media injection as well as minimizes motion artifacts. Visualization of small vessels may also be improved by suppressing peritoneal fat signal and signal from fat surrounding the kidneys.

Similarly, in breast imaging applications, suppressing signal from fat considerably improves visualization of small tumors. It is generally well known that upon injection of a contrast media, tumors enhance. Depending on the contrast media washout characteristics, the tumor is either classified as benign or malignant. To improve sensitivity (detection of small tumors) and specificity (ability to classify tissue as normal and lesions as benign or malignant), a high spatial resolution time-resolved sequence with good fat suppression is typically required. A conventional method of effecting fat suppression is to apply a spectrally selective saturation pulse, which is repeated every TR. A drawback of this conventional method is that the scan time is prohibitively increased which negatively affects patient throughput, increases scan time and patient discomfort, and increases the likelihood of patient motion-induced artifacts. Alternatively, k-space acquisitions may be segmented such that fat saturation pulses are applied every N TRs instead of every TR. However, with this technique, it has been shown that steady state effects and differential weighting of the center of k-space due to $T_1$ recovery of the fat signal negatively affects image quality. Further, the effectiveness of fat suppression is also compromised.

It would therefore be desirable to have a system and method capable of tissue suppression with elliptical centric phase ordered acquisition of MR data without negatively affecting patient throughput as well as improving image quality.

BRIEF DESCRIPTION OF THE INVENTION

The present invention provides a system and method of enhanced magnetic preparation suppression that overcomes the aforementioned drawbacks. An imaging technique is disclosed such that k-space is segmented into a number of partitions. The central regions of k-space may then be acquired prior to the periphery of k-space. The imaging technique also includes the application of saturation pulses at a variable rate. In this regard, the saturation pulses are applied as a function of the distance a particular partition for which MR data is being acquired is from the center of k-space. For example, the saturation pulses are played out such that suppression occurs more frequently during MR data acquisition in a region closer to the center of k-space than that in a region farther from the center of k-space. As the saturation pulses are played out less frequently in regions farther away from the center of k-space, it also becomes necessary to modulate the amplitude of the saturation pulses, which minimizes modulation in longitudinal fat magnetization between the central k-space regions and the outer k-space regions, thereby minimizing ghosting artifacts.

Therefore, in accordance with one aspect of the present invention, a method of MR imaging includes the step of partitioning k-space into a number of partitions. The partitions are defined such that each increases in distance from the center of k-space. The method also includes the step of applying magnetic preparation pulses and acquiring data such that a rate by which the magnetic preparation pulses are applied is a function of the incremental distance a partition of MR data is from the center of k-space. Further, the method includes the step of varying the amplitude of the magnetic preparation pulses based on the incremental distance a partition of MR data is from the center of k-space.

In accordance with another aspect of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to partition k-space into a number of partitions, each having an increased distance from a center of k-space. The computer is programmed to apply magnetic preparation pulses at first rate during data acquisition for a first partition and apply magnetic preparation pulses at a second rate, different from the first rate, during data acquisition for a second partition. The computer is also programmed to vary the amplitude of the magnetic preparation pulses between the first radial partition and the second radial partition.

In accordance with another aspect of the invention, the invention is embodied in a computer program stored on a computer readable storage medium and having instructions which, when executed by a computer, cause the computer to partition k-space data into a number of partitions, wherein each is a given distance from a center of k-space. The computer is further caused to play out a magnetic preparation pulse at a different rate for each partition, the rate being dependent on the given distance a partition is from the center of k-space. The computer is also caused to vary the amplitude of the magnetic preparation pulses, the amplitude being dependent upon the given distance a partition is from the center of k-space.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

A system is shown and will be described with respect to the acquisition of MR data with enhanced magnetic preparation. The system is configured to carry out an elliptical centric phase ordered acquisition in k-space. Other acquisition protocols are also supported and applicable with the present invention. The present invention will also be described with respect to fat suppression but is equivalently applicable with other magnetization preparation techniques such as IR preparation, $T_2$ preparation, magnetization transfer, and the like.

Figure 1:
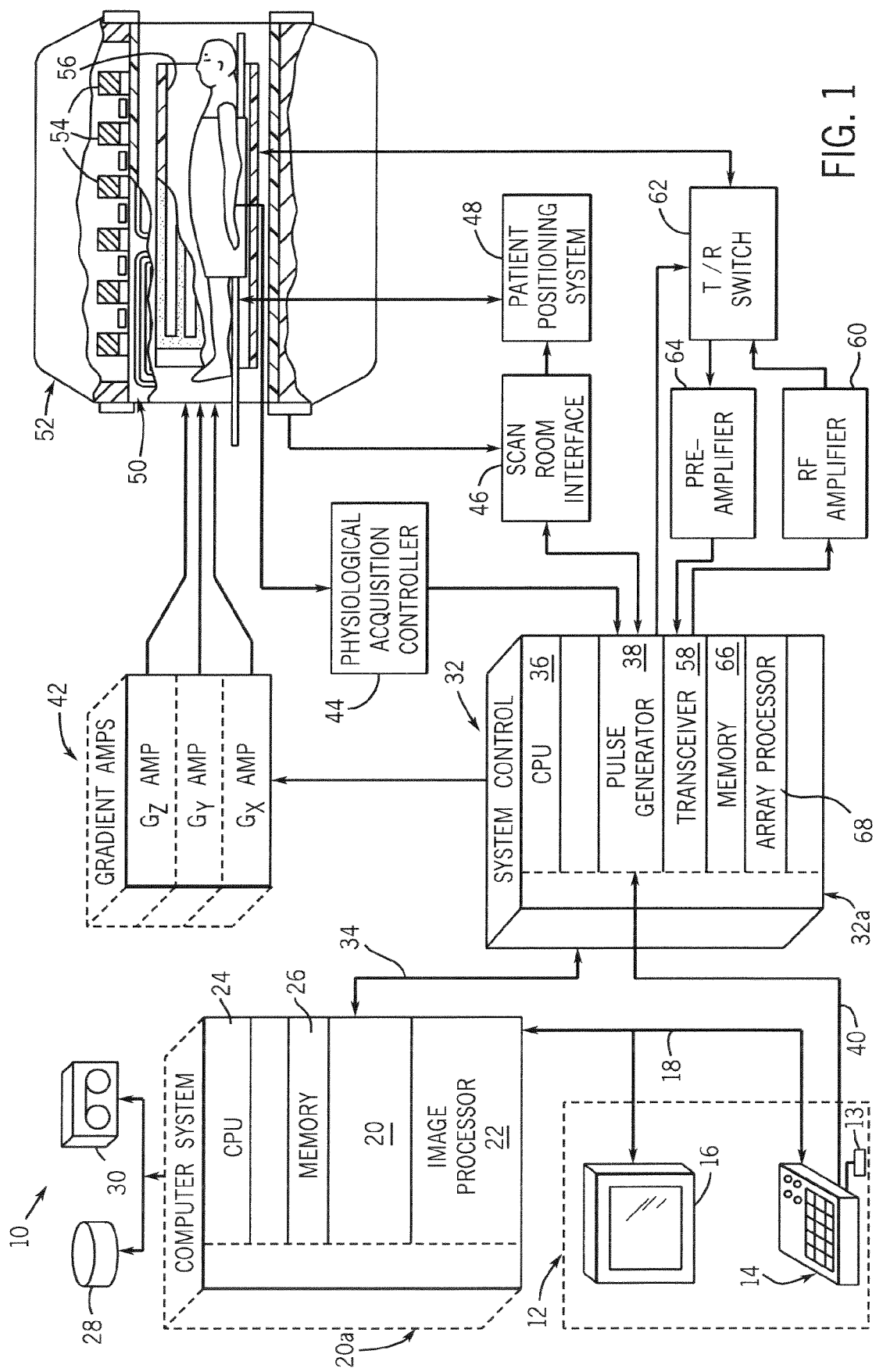
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
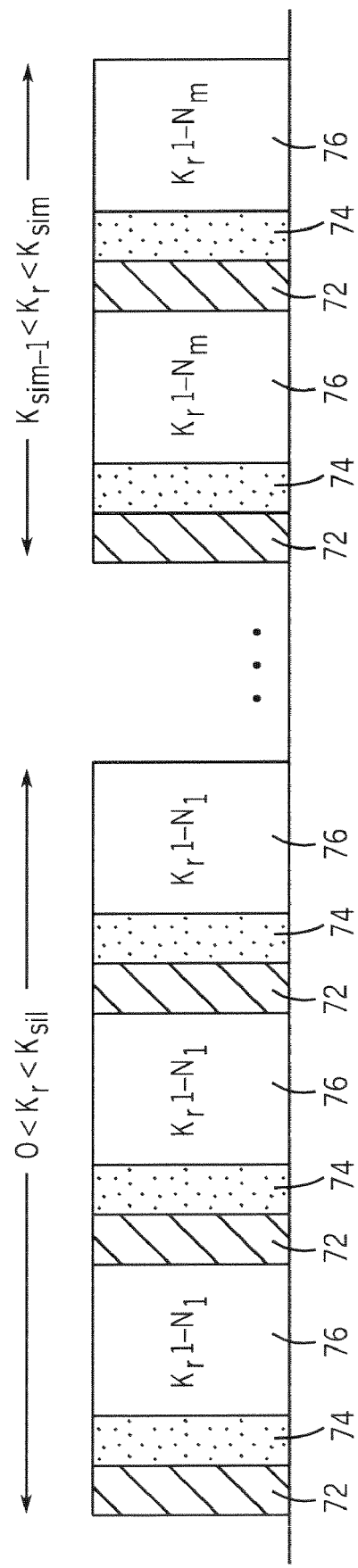
FIG. 2 is a schematic representation of an imaging technique in accordance with the present invention.

Referring now to FIG. 2, an imaging technique in accordance with the present invention is schematically illustrated. As will be described, imaging technique 70 implements variable rate application of magnetic preparation pulses, e.g. saturation pulses, to suppress magnetization in a tissue prior to MR data acquisition. Imaging technique 70 is particularly applicable for elliptical centric phase ordered acquisitions of MR data and, as such, $k_y$–$k_z$ space is reordered such that data is acquired in the order of increasing radius $k_r$. $k_r$ may be defined by the following expression:

$$k_r = \sqrt{(k_y^2 + k_z^2)}$$  Eqn. 1.

As noted above, a significant contribution at the power spectrum of the signal comes from the central region of k-space and hence, the center of k-space is a major determinant of image contrast. As such, to improve image contrast, the center region of k-space is acquired before the periphery is acquired. The present invention is also equivalently applicable with non-radial k-space acquisition.

In conventional elliptical centric phased ordered acquisitions, saturation pulses are applied at a uniform rate, i.e. every N TRs, and k-space lines are acquired in a centric fashion so that fat saturation contrast is maximized and effects from recovering fat signal and k-space weighting are sub-optimal. In contrast, with imaging technique 70, radial k-space $k_r$ is segmented into M partitions $0 < k_r < k_{si1}$, $k_{si1} <= k_r < k_{si1}$ ... $K_{siM-1} <= k_r < k_{siM}$. Further, the rate by which saturation pulses 72 are applied varies or is a function of the distance a partition for which MR data is being acquired is from the center of k-space. Specifically, the rate with which the saturation pulses 72 are played out decreased with increasing $k_r$. In the first partition, $0 < k_r < k_{si1}$, saturation pulses are played out every $N_1$ TRs. In the second partition, $k_{si1} < k_r < k_{si2}$, every $N_2$ TRs, and so on with $N_1 < N_2 < ... N_{M-1} < N_M$. In this regard, the rate by which the saturation pulses 72 are played out varies from one partition to another, and suppression is maximized and differential weighting of k-space is minimized while acquiring the central region in k-space.

To reduce ghosting artifacts from steady state effects, dummy acquisitions 74 are played out following each saturation pulse 72 and prior to data acquisition 76 in each partition. While not required, implementation of dummy acquisition 74 may greatly improve image quality with the reduction of ghosting artifacts typically associated with steady state effects. Additionally, the partitioning or segmentation of radial k-space and the subsequent acquisitions may be constructed to meet scan time requirements for a specific application.

Figure 3:
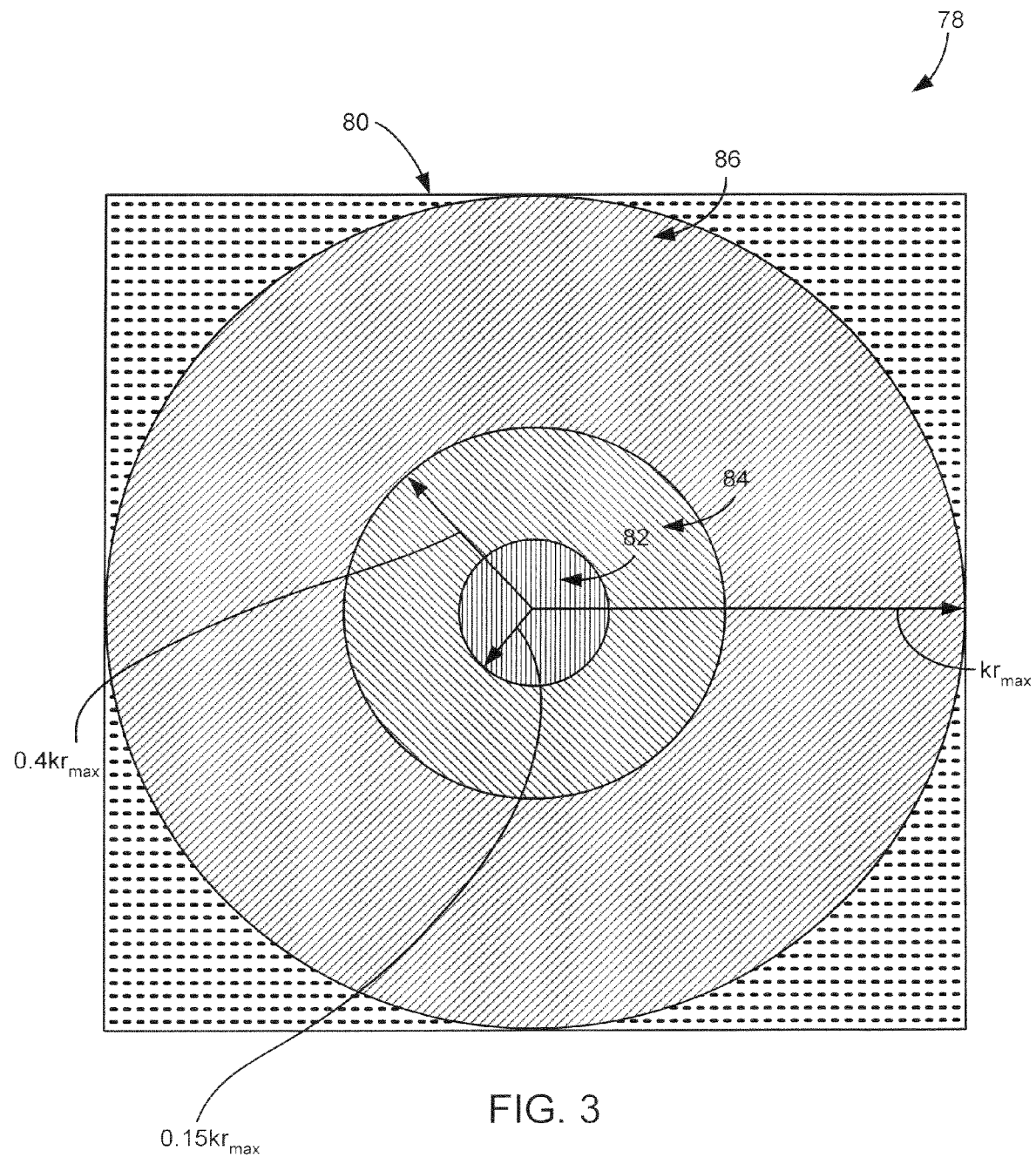
FIG. 3 is a graphical representation of a radial acquisition in k-space in accordance with the present invention.

As set forth above, imaging technique 70 may utilize a partitioned radial k-space such that M partitions are defined. A partitioned radial k-space acquisition 78 is illustrated in FIG. 3. In the illustrated example, k-space 80, $k_r$, may be partitioned into three regions 82, 84, and 86 of radii 0.15 $k_{rmax}$, 0.4 $k_{rmax}$, and 1.0 $k_{rmax}$, respectively. With this example, for data acquisition in the first region 82, saturation pulses may be played out every 5 TRs, every 15 TRs for data acquisition in the second region or partition 84, and every 40 TRs for data acquisition in the third partition 86. That is, $N_1$=5, $N_2$=15, and $N_3$=40. With this example, a non-linear segmentation of partitioning of radial k-space is employed. However, one skilled in the art will readily appreciate that a linear partitioning of k-space may also be used. For example, imaging technique 70 may be constructed such that saturation pulses are played out every 10 TRs for a first region, every 20 TRs for a second region, and every 30 TRs for a third region. The number of partitions as well as the relative size of each partition depends upon the particular imaging application that is to be carried out. That is, the segmentation or the choice of the number of partitions and the k-space radial boundaries are dependent on the k-space extent of a 3D image field-of-view. In this regard, it is desirable to maintain as small a k-space discontinuity as possible between adjacent k-space views.

Figure 4:
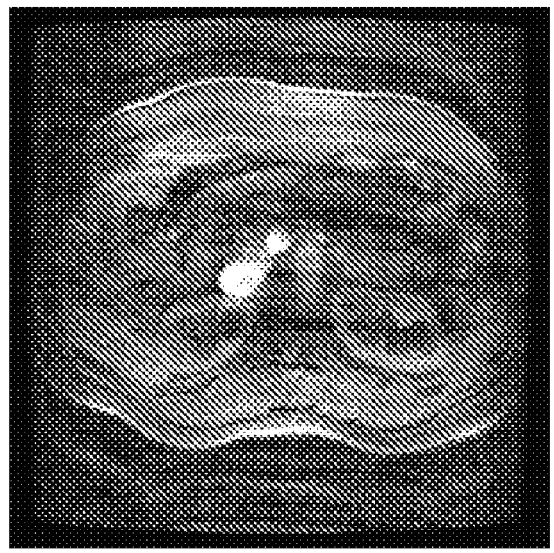
FIG. 4 is an abdominal image generated from MR data acquired with a conventional pulse sequence having fat saturation pulses played out every 20 TRs.
Figure 5:
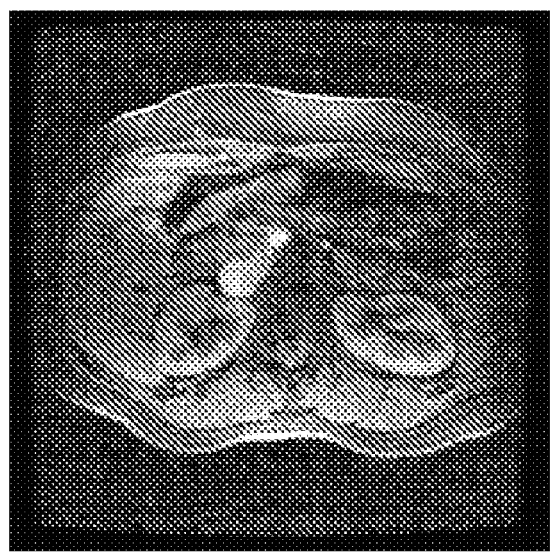
FIG. 5 is an abdominal image generated from MR data acquired with a pulse sequence in accordance with one aspect of the present invention.

Imaging technique 70 is particularly well-suited for performing fat suppressed contrast enhanced abdominal scans for improved delineation of vessels and structures. As shown in FIGS. 4 and 5, an image (FIG. 5) generated from MR data acquired using a pulse sequence in accordance with present invention has significantly less ghosting than an image (FIG. 4) generated from MR data acquired using a conventional pulse sequence. FIG. 4 is an abdominal breath-hold image generated from MR data acquired using a conventional pulse sequence with fat saturation pulses played out every 20 TRs.

In contrast, FIG. 5 is an abdominal breath-hold image generated from MR data acquired using an elliptical centric phase ordered acquisition with variable rate magnetic preparation. As is readily apparent from a comparison of the images, ghosting is more prevalent in the image of FIG. 4. Additionally, playing out dummy acquisitions would further improve the degree of suppression in the image of FIG. 5.

Imaging technique 70 is also well suited for achieving a high degree of fat suppression without compromising temporal resolution in contrast-enhanced first pass breast imaging applications for the acquisition of MR data using an MR system such as that described and shown with respect to FIG. 1. However, imaging technique 70 is also applicable to other magnetization preparation protocols such as those that implement IR preparation, $T_2$ preparation, magnetization transfer, and the like. Further, imaging technique 70 may be embodied in a computer program that when executed by a computer causes the computer to acquire MR data with an elliptical centric phase ordered acquisition using variable rate suppression. Additionally, the computer program may be stored on a transportable or transferable medium such as a computer data signal embodied in a carrier wave that is uploadable/downloadable to an MR imaging apparatus such as that described with respect to FIG. 1.

While the above technique successfully suppresses fat signals by applying saturation pulses at a variable rate, a further embodiment of the invention includes modulating the amplitude of the saturation pulses to minimize modulation in longitudinal fat magnetization between the central k-space regions and peripheral k-space regions. Specifically, as the saturation pulses are played out frequently in a central k-space region (e.g. every 5 TRs), the time for $T_1$ recovery for fat is minimal. In this way, the longitudinal fat magnetization at the end of the 5 TRs is very small. However, as the saturation pulses are played out less frequently in peripheral regions of k-space (e.g. every 15-40 TRs), the time for $T_1$ recovery for fat increases exponentially, thereby increasing longitudinal fat magnetization and, ultimately, observable ghosting artifacts. As will be shown in FIG. 6, the present embodiment remedies the increase in fat magnetization by modulating the amplitude of the saturation pulses for the different k-space regions.

Figure 6:
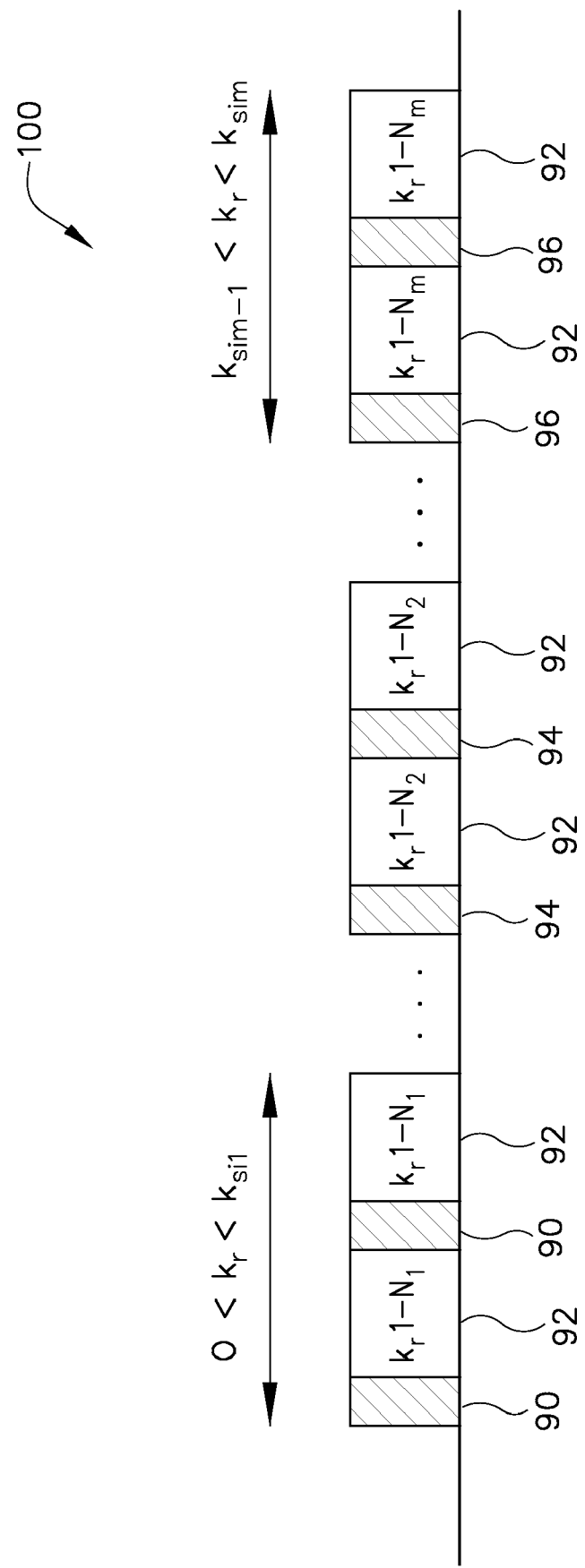
FIG. 6 is a schematic representation of an image technique in accordance with another embodiment of the present invention.

Referring to FIG. 6, an imaging technique in accordance with the present embodiment is schematically illustrated. As will be described, imaging technique 100 implements variable rate application of magnetic preparation pulses (e.g. saturation pulses) to suppress magnetization in a tissue prior to MR data acquisition. Imaging technique 100 also involves modulating the amplitude of the saturation pulses of different k-space regions to prevent increases in longitudinal fat magnetization.

Again, as is similarly shown with respect to imaging technique 70 in FIG. 2, imaging technique 100 illustrates that radial k-space $k_r$ is segmented into M partitions $0<k_r<k_{si1}$, $k_{si1}<=k_r<k_{si1} \ldots K_{siM-1}<=k_r<k_{siM}$. Further, the rate by which saturation pulses 90, 94, and 96 are applied varies or is a function of the distance a partition for which MR data is being acquired is from the center of k-space. Specifically, the rate with which the saturation pulses 90, 94, and 96 are played out decreased with increasing $k_r$. In the first partition, $0<k_r<k_{si1}$, saturation pulses are played out every $N_1$ TRs. In the second partition, $k_{si1}<k_r<k_{si2}$, every $N_2$ TRs, and so on with $N_1<N_2<\ldots N_{M-1}<N_M$. In this regard, the rate by which the saturation pulses 90, 94, and 96 are played out prior to data acquisition 92 varies from one partition to another, and suppression is maximized and differential weighting of k-space is minimized while acquiring the central region in k-space.

According to this embodiment, the amplitude of saturation pulses 90, 94, and 96 are also varied from one partition to another, which is done to avoid jumps in longitudinal fat magnetization between partitions. For example, saturation pulse 90 may have an initial saturation pulse flip angle $\theta_1$ of 130°, which is sufficient amplitude for holding longitudinal fat magnetization to a minimum when the saturation pulses are played out frequently (i.e. every $N_1$ TRs). However, as saturation pulses are played out less frequently in the peripheral regions of k-space, it becomes necessary to increase the amplitude of the saturation pulses to account for potential increases in longitudinal fat magnetization. The saturation pulse 94 may require a saturation pulse flip angle $\theta_2$ of 150°, while saturation pulse 96 may require a saturation pulse flip angle $\theta_3$ of 170°. By modulating the saturation pulse flip angles as the saturation pulses are played out less frequently, the increase in time for $T_1$ recovery for fat is countered by the increase in saturation pulse amplitude. Thus, longitudinal fat magnetization is minimized throughout the entire imaging sequence, and ghosting artifacts are greatly reduced.

It is to be noted that the above values for the saturation pulse flip angles are set forth strictly for exemplary purposes, and are in no way limiting to the invention. The amplitude values themselves can be automatically determined using standard Bloch equation simulation tools, wherein an initial saturation pulse flip angle is chosen for the central region of k-space, while the flip angles for the saturation pulses of peripheral regions are varied by small increments, either increasingly or decreasingly, until the flip angle value providing for the least differential fat magnetization between k-space regions is calculated. In this way, there is a smooth transition between the values of different k-space regions, which also aids in preventing observable ghosting artifacts in the final image. Also, while it is not illustrated in FIG. 6, the imaging technique 100 can also include playing out dummy acquisitions following each saturation pulse and prior to data acquisition, as is similarly shown for imaging technique 70 in FIG. 2.

Therefore, in accordance with one embodiment of the present invention, a method of MR imaging includes the step of partitioning k-space into a number of partitions. The partitions are defined such that each increases in distance from the center of k-space. The method also includes the step of applying magnetic preparation pulses and acquiring data such that the rate of application of magnetic preparation pulses is varied as a function of the distance from the center of k-space i.e. the preparation pulses are applied more frequently for data closer to the center of k-space and less frequently for MR data near the periphery of k-space. Further, the method includes the step of varying the amplitude of the magnetic preparation pulses based on the incremental distance a partition of MR data is from the center of k-space.

In accordance with another embodiment of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to partition k-space into a number of partitions, each having an increased distance from a center of k-space. The computer is programmed to apply magnetic preparation pulses at first rate during data acquisition for a first partition and apply magnetic preparation pulses at a second rate, different from the first rate, during data acquisition for a second partition. The computer is also programmed to vary the amplitude of the magnetic preparation pulses between the first radial partition and the second radial partition.

In accordance with another embodiment of the invention, the invention is embodied in a computer program stored on a computer readable storage medium and having instructions which, when executed by a computer, cause the computer to partition k-space data into a number of partitions, wherein each is a given distance from a center of k-space. The computer is further caused to play out a magnetic preparation pulse at a different for each partition, the rate being dependent on the given distance a partition is from the center of k-space. The computer is also caused to vary the amplitude of the magnetic preparation pulses, the amplitude being dependent upon the given distance a partition is from the center of k-space.

The present invention has been described in terms of the preferred embodiment, and it is recognized that equivalents, alternatives, and modifications, aside from those expressly stated, are possible and within the scope of the appending claims.

What is claimed is:

1. A method of MR imaging comprising the steps of:
    partitioning k-space into a number of partitions, wherein the partitions incrementally increase in distance from a center of k-space;
    applying magnetic preparation pulses and acquiring data such that a rate by which the magnetic preparation pulses are applied is a function of the incremental distance a partition of MR data is from the center of k-space; and
    varying the amplitude of the magnetic preparation pulses based on the incremental distance a partition of MR data is from the center of k-space.

2. The method of claim 1 wherein the magnetic preparation pulses are saturation pulses, and further comprising the step of decreasing the rate by which the saturation pulses are applied as the distance a partition of MR data is from the center of k-space increases.

3. The method of claim 1 further comprising the step of incrementally increasing the amplitude of the magnetic preparation pulses based on the incremental distance a partition of MR data is from the center of k-space.

4. The method of claim 3 wherein the amplitude of the magnetic preparation pulses is determined using Bloch equation simulation tools.

5. The method of claim 1 further comprising the step of playing out at least one dummy acquisition after application of each magnetic preparation pulse.

6. The method of claim 1 further comprising the step of playing out the magnetic preparation pulses every $N_i$ TR for an ith partition, wherein $N_1 < N_2 \ldots < N_{M-1} < N_M$, and M corresponds to the number of partitions.

7. The method of claim 1 further comprising the step of determining the number of partitions based on an FOV from which MR data is to be acquired.

8. The method of claim 7 further comprising the step of determining the number of partitions to minimize k-space discontinuity between adjacent k-space views.

9. The method of claim 1 wherein the magnetic preparation pulses are fat saturation pulses, and further comprising the step of maximizing fat saturation while minimizing differential weighting of k-space while acquiring central region k-space.

10. The method of claim 1 wherein the data acquisition in k-space includes a radial acquisition in k-space.

11. An MRI apparatus comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
        partition k-space into a number of partitions, each having an increased distance from a center of k-space;
        apply magnetic preparation pulses at a first rate during data acquisition for a first radial partition;
        apply magnetic preparation pulses at a second rate, different from the first rate, during data acquisition for a second radial partition; and
        vary the amplitude of the magnetic preparation pulses between the first radial partition and the second radial partition.

12. The MRI apparatus of claim 11 wherein the first rate and second rate are a function of partition distance from the center of k-space.

13. The MRI apparatus of claim 11 wherein the amplitude of the magnetization preparation pulses increases incrementally between the first radial partition and the second radial partition.

14. The MRI apparatus of claim 13 wherein the magnetization preparation pulses are saturation pulses.

15. The MRI apparatus of claim 11 wherein the computer is further programmed to play out a number of dummy acquisitions after each saturation pulse.

16. The MRI apparatus of claim 11 wherein the computer is further programmed to determine dimensions of an FOV and, from the dimensions, determine a number of radial partitions such that discontinuities between adjacent k-space locations are reduced.

17. A computer program representing a set of instructions that when executed by a computer causes the computer to:
    partition k-space data into a number of partitions, each a given distance from a center of k-space;
    play out a magnetic preparation pulse at a different rate for each partition, the rate being dependent on the given distance a partition is from the center of k-space; and
    vary the amplitude of the magnetic preparation pulses, the amplitude being dependent upon the given distance a partition is from the center of k-space.

18. The computer program of claim 17 wherein the set of instructions further causes the computer to define an elliptical centric phase ordered acquisition of k-space and wherein each partition is centered about a center of k-space such that magnetic preparation occurs more frequently during MR data acquisition of a partition closer to the center of k-space than that of a partition farther from the center of k-space.

19. The computer program of claim 17 wherein the amplitude of the magnetization preparation pulses increases incrementally based on the given distance a partition is from the center of k-space.

20. The computer program of claim 17 wherein the set of instructions further causes the computer to define the boundaries and the number of partitions such that k-space discontinuity between adjacent k-space views is reduced.

* * * * *